US009227242B2

(12) United States Patent
Myers et al.

(10) Patent No.: US 9,227,242 B2
(45) Date of Patent: Jan. 5, 2016

(54) CONTAINMENT OF MOLTEN ALUMINUM USING NON-WETTING MATERIALS

(71) Applicants: Jason D. Myers, Alexandria, VA (US); Jesse A. Frantz, Landover, MD (US); Guillermo R. Villalobos, Springfield, VA (US); Jasbinder S. Sanghera, Ashburn, VA (US); Bryan Sadowski, Falls Church, VA (US); Robel Y. Bekele, Washington, DC (US)

(72) Inventors: Jason D. Myers, Alexandria, VA (US); Jesse A. Frantz, Landover, MD (US); Guillermo R. Villalobos, Springfield, VA (US); Jasbinder S. Sanghera, Ashburn, VA (US); Bryan Sadowski, Falls Church, VA (US); Robel Y. Bekele, Washington, DC (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 174 days.

(21) Appl. No.: 14/075,239

(22) Filed: Nov. 8, 2013

(65) Prior Publication Data
US 2014/0239563 A1   Aug. 28, 2014

Related U.S. Application Data

(60) Provisional application No. 61/770,742, filed on Feb. 28, 2013.

(51) Int. Cl.
B22D 41/08 (2006.01)
B22D 41/02 (2006.01)

(52) U.S. Cl.
CPC .................................. B22D 41/02 (2013.01)

(58) Field of Classification Search
CPC ....................................................... B22D 41/02
USPC ................................... 266/280, 286; 432/264
See application file for complete search history.

(56) References Cited

U.S. PATENT DOCUMENTS 1,570,064 A * 1/1926 Jackman ....................... 432/264

FOREIGN PATENT DOCUMENTS

GB            745257       *   2/1956

* cited by examiner

Primary Examiner — Scott Kastler
(74) Attorney, Agent, or Firm — US Naval Research Laboratory; Stephen T. Hunnius

(57) ABSTRACT

A method of containing molten aluminum using non-wetting materials comprising depositing $MgAl_2O_4$, or one selected from an oxide, $Al_2O_3$, nitride, AlN, BN, carbide, and SiC, onto a crucible. An apparatus for containment of molten aluminum using non-wetting materials comprising a layer of $MgAl_2O_4$, or one selected from an oxide, $Al_2O_3$, nitride, AlN, BN, carbide, and SiC, deposited onto a crucible.

3 Claims, 2 Drawing Sheets

CONTAINMENT OF MOLTEN ALUMINUM USING NON-WETTING MATERIALS

REFERENCE TO RELATED APPLICATION

This application is a non-provisional of, and claims priority to and the benefits of, U.S. Provisional Patent Application No. 61/770,742 filed on Feb. 28, 2013, the entirety of which is hereby incorporated by reference.

BACKGROUND

This disclosure pertains to a method and apparatus of containing molten aluminum using a barrier layer of a non-wetting material.

Thermal evaporation is a very common method of depositing thin films of aluminum. In this technique, aluminum shot is placed into a crucible that is typically made of graphite, a refractory metal, or an oxide, and heated using either an electron beam or resistive coils. Unfortunately, molten aluminum has a strong propensity to wet most crucible materials and is highly corrosive to refractory metals, such as tungsten and molybdenum. As the molten aluminum creeps during the deposition, it can wet out onto other system elements, solidify on the backside of the crucible and cause thermal shock and cracking, corrode resistive heating elements, and change the thermal conduction properties of the crucible. This problem is typically managed by frequently replacing crucibles, leading to excess cost and material waste.

SUMMARY OF DISCLOSURE

Description

This disclosure pertains to a method and apparatus of containing molten aluminum using a barrier layer of a non-wetting material.

DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings.

DETAILED DESCRIPTION OF THE INVENTION

We discuss here a method to contain molten aluminum within a crucible using non-wetting barrier layers.

The non-wetting material is chosen to have a surface energy that results in a large contact angle (i.e. 90°) when in contact with molten aluminum.

The non-wetting material can be deposited using a variety of methods.

As the molten aluminum wets out its container, the material is stopped at the edge of the deposited material and will not advance further, prolonging crucible lifetime and reducing source material waste.

Additionally, while this initial disclosure references laboratory-scale containment, the technique is applicable to containers of any size and shape. This disclosure solves a real practical problem which affects the commercial market.

Example 1

$MgAl_2O_4$ (spinel) was deposited using RF magnetron sputtering onto two Fabmate (densified graphite) crucibles with an energy density of ~9 $W/cm^2$ and a pressure of 1-10 mT with the crucibles held at room temperature for an estimated spinel film thickness of 500-1000 nm.

The crucibles were rotated at ~10 rpm during deposition.

The crucibles were masked off using polyimide adhesive tape to confine the deposited spinel to the rim of the crucible.

After deposition, the polyimide tape was removed and the crucibles were wiped clean using solvents.

Aluminum shot is added to the crucible, which is subsequently installed in a high vacuum electron beam evaporation chamber. The electron beam is rastered in a Lissajous pattern to heat the aluminum, with care taken to avoid direct heating of the rim.

The crucible is heated to ~1200° C., at which point aluminum reaches the desired deposition rate.

We have found the method and apparatus as discussed herein extends the lifetime of crucibles.

Another advantage includes reduced waste from discarded source material.

Furthermore, the method and apparatus as discussed herein reduces damage potential from aluminum creep onto system components.

These advantages are demonstrated in the figures.

Figure 2:
FIG. 2: Illustration of a used Fabmate crucible without spinel-coated rims. Fabmate crucible without spinel coating after one aluminum deposition. The rim is entirely coated with aluminum, and it is beginning to creep out of the crucible in one region.

FIG. 2 illustrates a used Fabmate crucible without spinel-coated rims. The Fabmate crucible shown is without spinel coating after one aluminum deposition.

Note the rim is entirely coated with aluminum, and it is beginning to creep out of the crucible in one region.

Figure 1:
FIG. 1: Illustration of a used Fabmate crucible with spinel-coated rims. Fabmate crucible with alternating bare and spinel-coated regions around the rim after one aluminum deposition. Note the straight lines of aluminum at the edge of the spinel film, indicating non-wetting behavior.

This is in contrast to FIG. 1 which illustrates a used Fabmate crucible with spinel-coated rims. This Fabmate crucible has alternating bare and spinel-coated regions around the rim after one aluminum deposition.

Note the straight lines of aluminum at the edge of the spinel film, indicating non-wetting behavior.

Instead of $MgAl_2O_4$, a variety of other materials can be used, including but not limited to oxides, such as $Al_2O_3$, or nitrides, such as AlN and BN, or carbides, such as SiC.

Instead of sputter deposition, other deposition methods can be used, such as chemical vapor deposition, thermal spray, or thermal evaporation, as well as dip coating or spray coating of precursors followed by thermal treatment.

Furthermore, suitable coatings can also be used to prevent wetting by other metals and alloys.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been illustrated and/or described with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What we claim is:

1. A method of manufacturing a crucible comprising:
   masking off a crucible using a mask to confine any deposition to the rim of the crucible;
   depositing $MgAl_2O_4$ onto the crucible; and
   rotating the crucible during deposition;
   wherein the step of depositing $MgAl_2O_4$ onto the crucible was via RF magnetron sputtering and wherein the RF magnetron sputtering was at an energy density of ~9 W/cm$^2$ and a pressure of 1-10 mT and wherein the crucible was held at room temperature for an estimated spinel film thickness of 500-1000 nm.

2. The method of manufacturing a crucible of claim 1 further comprising the steps of;
   removing the mask from the crucible; and
   cleaning the crucible using solvents.

3. The method of manufacturing a crucible of claim 1 wherein the step of rotating the crucible during deposition was at ~10 rpm during deposition.

* * * * *